(12) United States Patent
Feno et al.

(10) Patent No.: US 10,250,249 B1
(45) Date of Patent: Apr. 2, 2019

(54) RECUPERATIVE GATE DRIVE CIRCUIT AND METHOD

(71) Applicant: Bel Power Solutions Inc., Santa Clara, CA (US)

(72) Inventors: Ivan Feno, Bertschikon (CH); Raphael Bernhard, Uster (CH); Michal Sir, Uster (CH)

(73) Assignee: Bel Power Solutions Inc., San Jose, CA (US)

( * ) Notice: Subject to any disclaimer, the term of this patent is extended or adjusted under 35 U.S.C. 154(b) by 3 days.

(21) Appl. No.: 15/638,467

(22) Filed: Jun. 30, 2017

(51) Int. Cl.
| | |
|---|---|
| H03K 17/0412 | (2006.01) |
| H02M 3/335 | (2006.01) |
| H03K 17/082 | (2006.01) |
| H03K 17/691 | (2006.01) |
| H02M 3/07 | (2006.01) |
| H03K 17/12 | (2006.01) |
| H03K 17/16 | (2006.01) |
| H03K 3/012 | (2006.01) |
| H03K 17/06 | (2006.01) |

(52) U.S. Cl.
CPC ........ *H03K 17/04123* (2013.01); *H02M 3/07* (2013.01); *H02M 3/33576* (2013.01); *H03K 3/012* (2013.01); *H03K 17/063* (2013.01); *H03K 17/0828* (2013.01); *H03K 17/122* (2013.01); *H03K 17/163* (2013.01); *H03K 17/691* (2013.01)

(58) Field of Classification Search
None
See application file for complete search history.

(56) References Cited

U.S. PATENT DOCUMENTS

| | | |
|---|---|---|
| 5,264,736 A | 11/1993 | Jacobson |
| 6,441,652 B1 | 8/2002 | Qian |
| 6,650,169 B2 | 11/2003 | Faye et al. |
| 6,967,520 B2 | 11/2005 | Takehara |
| 7,285,876 B1 | 10/2007 | Jacobson |
| 7,459,945 B2 | 12/2008 | Omura |
| 7,598,792 B2 | 10/2009 | Liu et al. |
| 7,612,602 B2 | 11/2009 | Yang et al. |
| 8,456,201 B2 | 6/2013 | Olivo |
| 9,503,079 B1 * | 11/2016 | Wang ................ H03K 17/0822 |
| 2011/0204860 A1 * | 8/2011 | Thiele .................. H02M 3/156 323/271 |

(Continued)

*Primary Examiner* — Cassandra Cox
(74) *Attorney, Agent, or Firm* — Patterson Intellectual Property Law, P.C.; Gary L. Montle

(57) ABSTRACT

A circuit and method are provided for recuperating energy and decreasing driver power consumption in a switching converter. An inductor is directly connected between a gate driver and a gate electrode of a switch. A first burst pulse signal is generated, wherein energy from a power source is stored in the inductor and transferred to a parasitic capacitance of the switch. A driving pulse signal is subsequently generated to the gate electrode of the switch, wherein the gate voltage is equal to the supply voltage and no balancing current flows through the inductor. After the driving pulse signal is terminated a second burst pulse signal is generated, wherein energy is accumulated in the inductive element and returned to the power source. The energy provided from the power source during the first burst pulse signal is equal to the energy returned to the power source during the second burst pulse signal.

20 Claims, 4 Drawing Sheets

(56) References Cited

U.S. PATENT DOCUMENTS

| | | | |
|---|---|---|---|
| 2013/0162322 A1* | 6/2013 | Tao | H03K 17/04123 327/381 |
| 2014/0203849 A1* | 7/2014 | Richardson | H03K 17/0424 327/109 |
| 2015/0092450 A1* | 4/2015 | Feno | H02M 3/33592 363/17 |
| 2015/0188404 A1* | 7/2015 | Shin | H03K 17/168 323/282 |
| 2016/0211743 A1* | 7/2016 | Harrison | H02J 3/1835 |
| 2016/0359481 A1* | 12/2016 | Leong | H03K 17/163 |

* cited by examiner

RECUPERATIVE GATE DRIVE CIRCUIT AND METHOD

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

BACKGROUND OF THE INVENTION

This invention relates to the field of electrical power conversion, particularly to semiconductor switch drivers required to provide a low power consumption.

Most contemporary power switching converters contain one or more power switching devices. In high power applications, a gate driving circuit is used to drive the switches on and off. A typical gate driving circuit is represented in FIG. 1. A controller 10 provides a control signal 12 for a driver 11 which acts as a buffer and provides sufficient turn-on and turn-off currents to drive the switching element Q1 on and off. Further by reference to FIG. 2, from the gate perspective the switching element Q1 may be characterized by an internal resistance Rg and a lumped capacitance Ciss.

An electric charge is provided by the driver 11 to charge the internal capacitance Ciss each time the switching element Q1 is turned on. The stored charge is to be extracted when the switching element Q1 is turned off, and the related energy is dissipated in the internal resistor Rg, an external resistor R1 coupled between the gate electrode and the driver 11, and the output buffer stage of the driver 11.

In some applications, gate drive power consumption is among the foremost causes of power loss, and accordingly is an impediment to the production and implementation of highly efficient power conversion circuits. Therefore, a solution to decrease the driver power consumption is required.

In various conventional high frequency power converters, drivers may be supplied from the power stage to build up a self-oscillating circuit. Other solutions known in the art include auxiliary switching elements, diodes or transformers, which may introduce additional cost and/or complexity to the converter design.

It would be desirable to provide a gate driving circuit for a power converter, having the benefits of decreased power consumption, but without requiring self-oscillating circuitry or the presence of auxiliary circuit components.

BRIEF SUMMARY OF THE INVENTION

A circuit and method are provided for recuperating energy and decreasing driver power consumption in a switching converter.

In one embodiment, a recuperative driver circuit as disclosed herein includes an inductor directly connected between a gate driver and a gate electrode of a switching element having a parasitic input capacitance. The gate driver is configured to receive driver control signals from a controller, and is further coupled to a power source. A first burst pulse signal is generated, wherein energy from the power source is stored in the inductor and transferred to a parasitic capacitance of the switch. A driving pulse signal is subsequently generated to the gate electrode of the switch, wherein the gate voltage is equal to the supply voltage and no balancing current flows through the inductor. After the driving pulse signal is terminated a second burst pulse signal is generated, wherein energy is accumulated in the inductive element and returned to the power source. The energy provided from the power source during the first burst pulse signal is equal to the energy returned to the power source during the second burst pulse signal.

In one aspect of the aforementioned embodiment, the inductor replaces an external gate resistor as is conventionally applied between the driver and the gate electrode of the switching element.

In another exemplary aspect, the controller is configured to produce the first burst pulse signal by generating a driver control signal at a first time to command a gate drive output high, and by generating a driver control signal at a second time to command the gate drive output low when a voltage across the gate electrode of the switching element reaches a predetermined value. This second time can be determined by characterization such that the predetermined value may be approximately 50% of a gate drive supply voltage from the power source.

In another exemplary aspect, the controller is configured to produce the driving pulse signal by generating a driver control signal at a third time to command the gate drive output high when energy stored in the inductive element between the first and second time has dissipated to zero and the voltage across the gate electrode of the switching element has reached approximately 100% of a gate drive supply voltage from the power source. The energy stored in the inductive element accordingly transfers to the parasitic capacitance of the switching element between the first time and the second time.

The controller may further be configured to terminate the driving pulse signal by generating a driver control signal at a fourth time to command the gate drive output low. In an exemplary embodiment, the controller subsequently produces the second burst pulse signal by generating a driver control signal at a fifth time to command the gate drive output high when a voltage across the gate electrode of the switching element reaches a first predetermined value, and by generating a driver control signal at a sixth time to command the gate drive output low when the voltage across the gate electrode of the switching element reaches a second predetermined value. The first predetermined value may for example be approximately 50% of a gate drive supply voltage from the power source, whereas the second predetermined value is approximately zero. Energy stored in the inductive element between the fourth time and the fifth time accordingly transfers to the power source between the fifth time and the sixth time.

In another aspect of the aforementioned embodiment, an amount of power provided by the power source during the first burst pulse signal is equal to an amount of power returned to the power source during the second burst pulse signal.

In another embodiment, a method of operation is disclosed herein for a gate driving circuit having an inductive element coupled between a gate driver and a gate electrode of a switching element. The method includes a first step of generating a first burst pulse signal from the gate driver, wherein energy from a power source is stored in the inductive element and transferred to a parasitic capacitance of the switching element. A second step comprises generating a driving pulse signal to the gate electrode of the switching element following the first burst pulse signal. A third step comprises generating a second burst pulse signal following the driving pulse signal, wherein energy is stored in the inductive element and returned to the power source.

In various embodiments, the driving circuit and method may be provided for a zero volt switching (ZVS) power converter, or more generally for switching elements implemented in ZVS applications or synchronous rectification, wherein the switch gate-source voltage waveform is substantially unaffected by charging and discharging of the Miller capacitance.

DETAILED DESCRIPTION OF THE INVENTION

Figure 1:
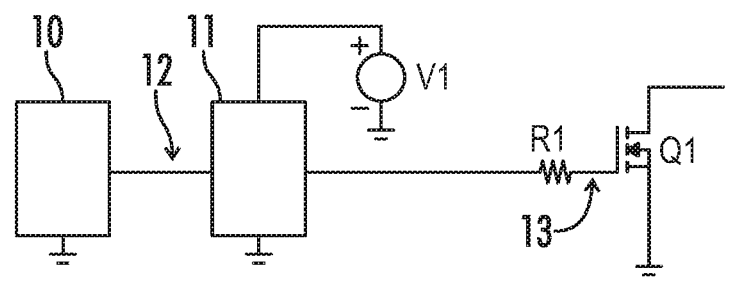
FIG. 1 is a simplified circuit block diagram representing a conventional switch driving scheme.
Figure 2:
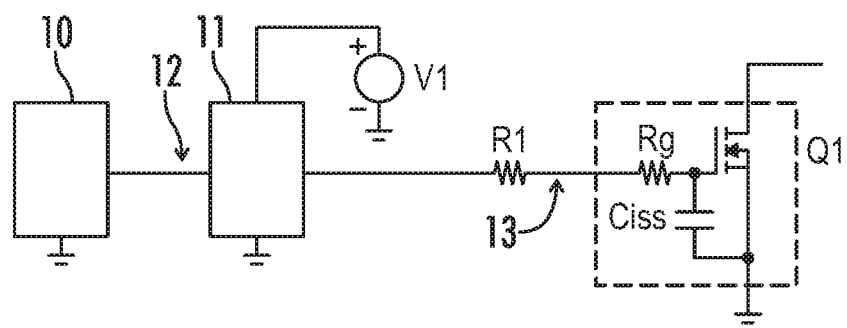
FIG. 2 is a simplified circuit block diagram depicting an internal representation of the switching transistor gate of FIG. 1.

Referring generally to FIGS. 1-8, various exemplary embodiments may now be described in detail of a method and an apparatus to recuperate the energy stored in the internal capacitance of a power switching device. Where the various figures may describe embodiments sharing various common elements and features with other embodiments, similar elements and features are given the same reference numerals and redundant description thereof may be omitted below.

Figure 3:
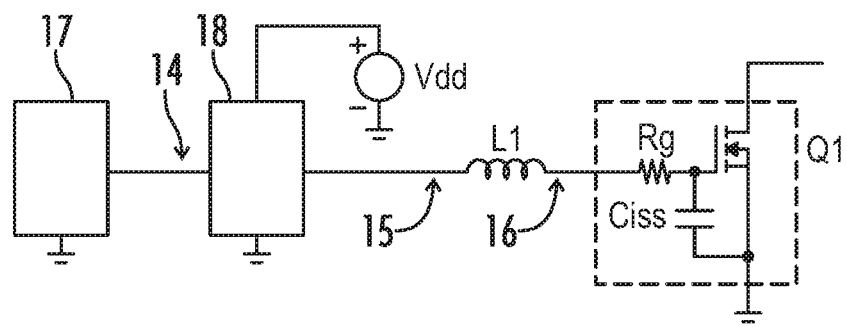
FIG. 3 is a simplified circuit block diagram representing an embodiment of a driving circuit as disclosed herein.

Referring now to FIG. 3, in one embodiment a gate driving circuit as disclosed herein includes a controller 17, a gate driver 18, a driver power source Vdd, a choke L1 and a power switching element Q1. The switching element Q1 is characterized by an internal resistance Rg and a lumped capacitance Ciss. The gate driver 18 is configured to receive driver control signals from the controller 17, and is further coupled to receive supply power from the power source Vdd. Briefly stated, an exemplary operation of the driving circuit includes generation of a first burst pulse signal, wherein energy from the power source Vdd is stored in the inductor L1 and transferred to a parasitic capacitance of the switching element Q1. A driving pulse signal is subsequently generated to the gate electrode of the switching element Q1, wherein the gate voltage is equal to the supply voltage Vdd and no balancing current flows through the inductor L1. After the driving pulse signal is terminated a second burst pulse signal is generated, wherein energy is accumulated in the inductive element L1 and returned to the power source Vdd. The energy provided from the power source Vdd during the first burst pulse signal is equal to the energy returned to the power source during the second burst pulse signal.

In certain exemplary embodiments for a power converter having a plurality of switching elements, a single controller 17 may be utilized with respect to a plurality of discrete gate drivers 18 for respective switching elements, wherein the gate drivers may for example include microcontrollers, integrated circuits, discrete circuit components, etc. In other embodiments, without limitation otherwise on the scope of the present disclosure, an integrated gate driver and controller may be used, providing for example a respective gate drive output terminal for each of a plurality of switching elements.

Figure 4:
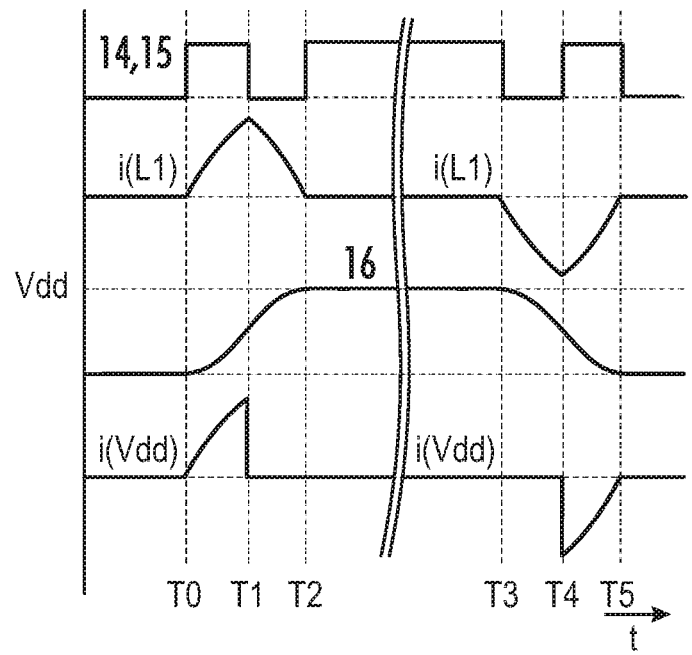
FIG. 4 is a graphical diagram representing various signal waveforms of an embodiment of the driving circuit as disclosed herein.

An exemplary signal timing relationship for the gate driving circuit is depicted in more detail by reference to FIG. 4.

At a first time T0 the controller 17 commands the control signal 14 high. The driver 18 output voltage 15 accordingly goes high as well, wherein current i(L1) starts to flow from the power source Vdd through the driver 18 and the choke L1 to the gate electrode of the switching element Q1.

At a second time T1 the gate voltage 16 reaches a first predetermined value, such as for example approximately 50% of the supply voltage Vdd, and the controller 17 commands the driver output 15 low to cut off an excessive amount of energy gained from the power source Vdd. Between the second time T1 and a third time T2, the energy stored in the inductor L1 is transferred to the gate capacitance Ciss.

The internal gate capacitance Ciss continuous to rise during this period so that, in at least the presently described embodiment, at the third time T2 there is no energy remaining in the inductor L1. Accordingly, at the third time T2 the gate voltage 16 reaches the gate drive supply voltage Vdd and the output of the driver 15 goes high again. Because the gate voltage 16 and the supply voltage Vdd are substantially equal, no balancing current flows through the inductor L1. Note that the outgoing power supply current i(Vdd) flows only during the time interval between the first time and the second time (T0-T1) and thus the energy provided by the power source Vdd is equal to the energy needed to charge the gate capacitance Ciss of the switching element Q1.

The driving pulse is terminated at a fourth time T3 when the driver output 15 transits low, forcing the current i(L1) through the inductor to ramp to a negative value. While the current i(L1) ramps down, the gate voltage 16 decreases. The energy stored in the internal capacitance Ciss of the switching element Q1 transfers to the inductor L1 and at a fifth time T4 the gate voltage 16 reaches a predetermined value, such as for example approximately 50% of the supply voltage Vdd.

At the fifth time T4 a second burst pulse is initiated, wherein the driver output voltage 15 briefly transits high to return the energy accumulated in the inductor L1 back to the power source Vdd. As the energy is flushed into the power source Vdd, the current i(L1) increases and at a sixth time T5 it reaches zero. As the gate voltage 16 reaches zero, the driver output 15 transits low again. At this point the gate voltage 16 is zero, and accordingly there is no longer any current flowing through the inductor L1.

Referring to the i(Vdd) waveform at the bottom of FIG. 4, note that the charge provided by the power source Vdd in association with the first burst pulse sequence (at turn-on) is equal to the charge returned back to the power source Vdd during the second burst pulse sequence (at turn-off).

Figure 5:
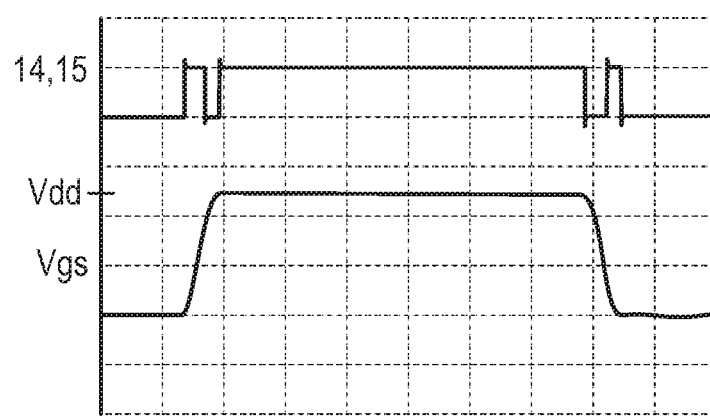
FIG. 5 is a graphical diagram presenting a scope record of the exemplary circuit waveforms.

In ideal applications of a gate driving circuit as disclosed herein, there are no parasitic elements causing losses, and the period between the first time and the second time (T1-T0) is equivalent to the period between the second time and the third time (T2−T1). Similarly, the period between the fourth time and the fifth time would ideally be equal to the period between the fifth time and the sixth time, such that T4−T3=T5−T4. However, in a practical application the first pulse is longer due to the parasitic elements (e.g., a resistance of the driver, series resistance of the gate-coupled choke L1, series resistance Rg of the gate electrode of the switching element) causing losses in the circuit. Therefore, one of skill in the art may appreciate that typically T1−T0>T2−T1 and T4−T3>T5−T4. These relationships are further illustrated via exemplary scope results as shown in FIG. 5, wherein a waveform of the control signal 14 and driver output 15 is represented alongside the gate voltage 16 of the switching element.

In various embodiments of a driving circuit as disclosed herein, it may be noted that no auxiliary switching elements are required to make the circuit function properly. For many practical applications, this may be appreciated as an important feature.

Figure 6:
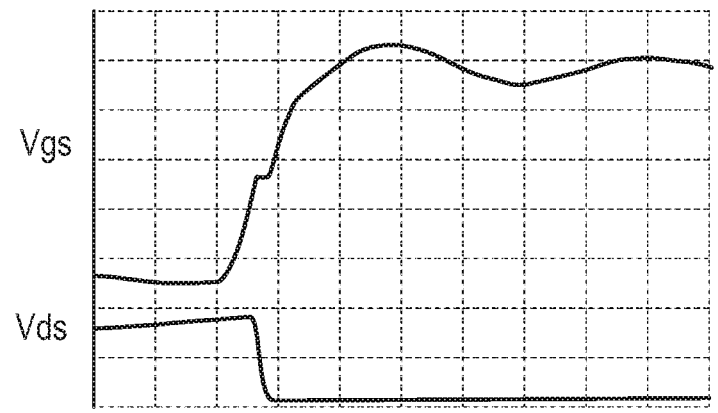
FIG. 6 is a graphical diagram presenting a scope record of the exemplary circuit waveforms for non-ZVS conditions.
Figure 7:
FIG. 7 is a graphical diagram presenting a scope record of the exemplary circuit waveforms after timing adjustment for non-ZVS conditions.

In various embodiments, specific practical applications of this driving approach include circuits wherein Miller capacitance does not affect the switch gate-source voltage (Vgs) waveform. The waveform represented in FIG. 5 is associated with just such an application. Referring in the alternative to FIG. 6, in one exemplary (e.g., non-ZVS) application the Vgs waveform might otherwise be affected due to Miller capacitance charge/discharge. Note the Miller zone on the gate-source voltage Vgs waveform during a falling transit of the drain-source voltage Vds. In cases where the gate-source voltage Vgs waveform distortion is not acceptable, the burst pulse timing may be adjusted to compensate the Miller charge, wherein a relatively smooth gate-source voltage Vgs waveform is produced, further by illustrative reference to FIG. 7.

Figure 8:
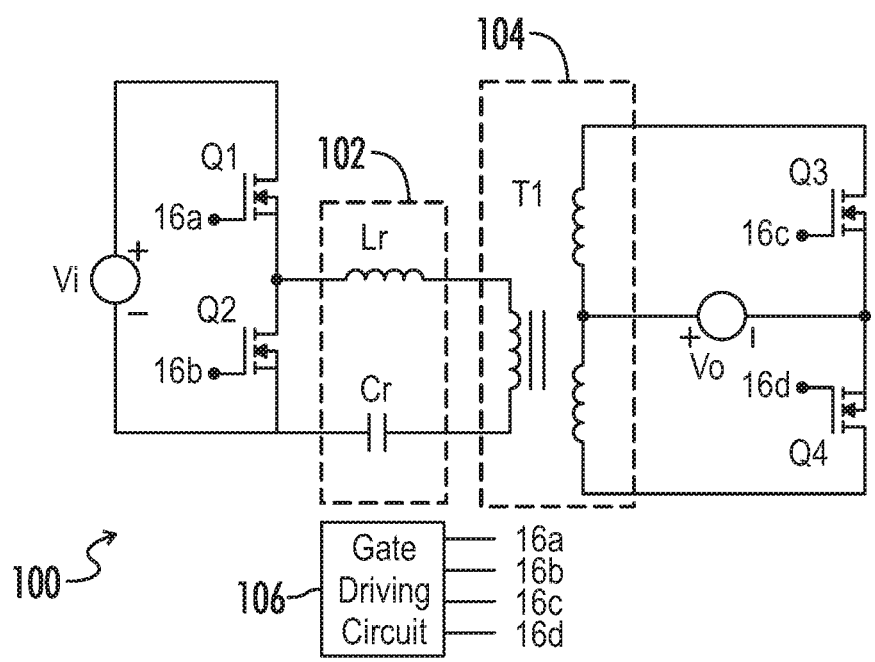
FIG. 8 is a circuit block diagram representing an exemplary power converter for incorporating various embodiments of a driving circuit as disclosed herein.

Referring next to FIG. 8 for illustrative and non-limiting purposes, an exemplary power converter 100 for utilizing a gate driving circuit 106 as disclosed herein may include an LLC-type converter having ZVS switching elements Q1, Q2 coupled across an input voltage supply Vi. A resonant circuit 102 may include a resonant inductor Lr and a resonant capacitor Cr coupled between the ZVS switching elements and an isolation circuit 104 including for example an isolation transformer T1. An output stage of the transformer may include synchronous rectifier switching elements Q3, Q4, with a converter output Vo being coupled on a first end to a node between the synchronous rectifiers Q3, Q4 and on a second end to a center tap between secondary windings of the isolation transformer T1. The gate driving circuit 106 may be configured to provide gate driving signals 16a-16d in a manner substantially as described above with respect to one or more of the switching elements Q1-Q4 in the power converter 100.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "circuit" means at least either a single component or a multiplicity of components, either active and/or passive, that are coupled together to provide a desired function. Terms such as "wire," "wiring," "line," "signal," "cconductor," and "bus" may be used to refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

The terms "switching element" and "switch" may be used interchangeably and may refer herein to at least: a variety of transistors as known in the art (including but not limited to FET, BJT, IGBT, IGFET, etc.), a switching diode, a silicon controlled rectifier (SCR), a diode for alternating current (DIAC), a triode for alternating current (TRIAC), a mechanical single pole/double pole switch (SPDT), or electrical, solid state or reed relays. Where either a field effect transistor (FET) or a bipolar junction transistor (BJT) may be employed as an embodiment of a transistor, the scope of the terms "gate," "drain," and "source" includes "base," "collector," and "emitter," respectively, and vice-versa.

The terms "power converter" and "converter" unless otherwise defined with respect to a particular element may be used interchangeably herein and with reference to at least DC-DC, DC-AC, AC-DC, buck, buck-boost, boost, half-bridge, full-bridge, H-bridge or various other forms of power conversion or inversion as known to one of skill in the art.

The terms "controller," "control circuit" and "control circuitry" as used herein may refer to, be embodied by or otherwise included within a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed and programmed to perform or cause the performance of the functions described herein. A general purpose processor can be a microprocessor, but in the alternative, the processor can be a microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A gate driving circuit for a switching element having a parasitic input capacitance, the circuit comprising:
a controller configured to generate driver control signals;
a power source;
a gate driver coupled to each of the controller and the power source, and configured to generate gate drive signals to the switching element, said gate drive signals corresponding to control signals from the controller,
wherein the gate drive signals comprise a first burst pulse signal, a driving pulse signal following the first burst pulse signal, and a second burst pulse signal following the driving pulse signal.

2. The gate driving circuit of claim 1, further comprising an inductive element coupled between the gate driver and a gate electrode of the switching element.

3. The gate driving circuit of claim 2, wherein the inductive element is directly connected on a first end to the gate driver and on a second end to the gate electrode of the switching element.

4. The gate driving circuit of claim 3, wherein the controller is configured to produce the first burst pulse signal
by generating a driver control signal at a first time to command a gate drive output high, and
by generating a driver control signal at a second time to command the gate drive output low when a voltage across the gate electrode of the switching element reaches a predetermined value.

5. The gate driving circuit of claim 4, wherein the predetermined value is approximately 50% of a gate drive supply voltage from the power source.

6. The gate driving circuit of claim 4, wherein the controller is configured to produce the driving pulse signal by generating a driver control signal at a third time to command the gate drive output high when energy stored in the inductive element between the first and second time has dissipated to zero and the voltage across the gate electrode of the switching element has reached approximately 100% of a gate drive supply voltage from the power source.

7. The gate driving circuit of claim 6, wherein the energy stored in the inductive element transfers to the parasitic capacitance of the switching element between the second time and the third time.

8. The gate driving circuit of claim 6, wherein the controller is configured to terminate the driving pulse signal by generating a driver control signal at a fourth time to command the gate drive output low, and to produce the second burst pulse signal
by generating a driver control signal at a fifth time to command the gate drive output high when a voltage across the gate electrode of the switching element reaches a first predetermined value, and
by generating a driver control signal at a sixth time to command the gate drive output low when the voltage across the gate electrode of the switching element reaches a second predetermined value.

9. The gate driving circuit of claim 8, wherein the first predetermined value is approximately 50% of a gate drive supply voltage from the power source and the second predetermined value is approximately zero.

10. The gate driving circuit of claim 9, wherein energy stored in the inductive element between the fourth time and the fifth time transfers to the power source between the fifth time and the sixth time.

11. The gate driving circuit of claim 10, wherein an amount of power provided by the power source during the first burst pulse signal is equal to an amount of power returned to the power source during the second burst pulse signal.

12. A method of operating a gate driving circuit having an inductive element coupled between a gate driver and a gate electrode of a switching element, the method comprising:
generating a first burst pulse signal from the gate driver, wherein energy from a power source is stored in the inductive element and transferred to a parasitic capacitance of the switching element;
generating a driving pulse signal to the gate electrode of the switching element following the first burst pulse signal; and
generating a second burst pulse signal following the driving pulse signal, wherein energy is stored in the inductive element and returned to the power source.

13. The method of claim 12, wherein the step of generating the first burst pulse signal comprises:
commanding a gate drive output high at a first time, and
commanding the gate drive output low at a second time when a voltage across the gate electrode of the switching element reaches a first predetermined value.

14. The method of claim 13, wherein the first predetermined value is approximately 50% of a gate drive supply voltage from the power source.

15. The method of claim 13, wherein the step of generating the driving pulse signal comprises commanding the gate drive output high when energy stored in the inductive element between the first and second time has dissipated to zero and the voltage across the gate electrode of the switching element has reached approximately 100% of a gate drive supply voltage from the power source.

16. The method of claim 15, further comprising terminating the driving pulse signal by commanding the gate drive output low at a fourth time, wherein the step of generating the second burst pulse signal comprises:
commanding the gate drive output high at a fifth time when a voltage across the gate electrode of the switching element reaches the first predetermined value, and
commanding the gate drive output low at a sixth time when the voltage across the gate electrode of the switching element reaches a second predetermined value.

17. The method of claim 16, wherein the second predetermined value is approximately zero.

18. The method of claim 16, wherein an amount of power provided by the power source during the first burst pulse signal is equal to an amount of power returned to the power source during the second burst pulse signal.

19. A zero volt switching (ZVS) power converter comprising:
an isolation transformer;
one or more switching elements positioned on a primary side of the isolation transformer and configured to operate under ZVS conditions;
one or more switching elements positioned on a secondary side of the isolation transformer and configured to operate as a synchronous rectifier; and
for each of the respective switching elements, gate driving circuitry coupled between a power source and a respective gate electrode, said gate drive circuitry configured to
generate a first burst pulse signal, wherein energy from the power source is stored in an inductive element and transferred to a parasitic capacitance of the switching element,
generate a driving pulse signal to the gate electrode of the switching element following the first burst pulse signal, and
generate a second burst pulse signal following the driving pulse signal, wherein energy is stored in the inductive element and returned to the power source.

20. The power converter of claim 19, wherein the inductive element is directly connected on a first end to a gate driver between the inductive element and the power source, and on a second end to the gate electrode of the respective switching element.

* * * * *